United States Patent
Yang et al.

(10) Patent No.: US 11,417,461 B2
(45) Date of Patent: Aug. 16, 2022

(54) TECHNIQUES AND APPARATUSES TO REDUCE INDUCTIVE CHARGING POWER LOSS

(71) Applicant: Google LLC, Mountain View, CA (US)

(72) Inventors: Liyu Yang, San Jose, CA (US); Liang Jia, Palo Alto, CA (US); Srikanth Lakshmikanthan, Milpitas, CA (US); Li Wang, Mountain View, CA (US); Qi Tian, San Jose, CA (US); YungChih Chen, New Taipei (TW); Veera Venkata Siva Nagesh Polu, Sunnyvale, CA (US); Stefano Saggini, Udine (IT); Mario Ursino, Udine (IT); Ruben Specogna, Udine (IT)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/176,685

(22) Filed: Feb. 16, 2021

(65) Prior Publication Data

US 2022/0139615 A1    May 5, 2022

(30) Foreign Application Priority Data

Oct. 29, 2020  (IT) .................. 102020000025678

(51) Int. Cl.
| | | |
|---|---|---|
| *H01F 38/14* | (2006.01) | |
| *H01F 27/28* | (2006.01) | |
| *H05K 1/02* | (2006.01) | |
| *H02J 50/12* | (2016.01) | |
| *H02J 7/02* | (2016.01) | |

(52) U.S. Cl.
CPC ......... *H01F 38/14* (2013.01); *H01F 27/2804* (2013.01); *H05K 1/028* (2013.01); *H05K 1/0298* (2013.01); *H01F 2027/2809* (2013.01); *H02J 7/02* (2013.01); *H02J 50/12* (2016.02); *H05K 2201/09227* (2013.01)

(58) Field of Classification Search
CPC ................. H01F 38/14; H01F 27/2804; H01F 2027/2809; H05K 1/028; H05K 1/0298; H05K 2201/09227
USPC ........................................................ 307/104
See application file for complete search history.

(56) References Cited

U.S. PATENT DOCUMENTS

| | | | |
|---|---|---|---|
| 10,374,464 B2 * | 8/2019 | Kurz | ..................... H01F 27/366 |
| 2006/0209487 A1 | 9/2006 | Schmidt et al. | |
| 2008/0122568 A1 | 5/2008 | Kan et al. | |

(Continued)

FOREIGN PATENT DOCUMENTS

EP    3564973    11/2019

OTHER PUBLICATIONS

"Search Report and Written Opinion", IT Application No. 102020000025678, dated Jun. 17, 2021, 8 pages.

(Continued)

*Primary Examiner* — Alfonso Perez Borroto
(74) *Attorney, Agent, or Firm* — Colby Nipper PLLC (57) ABSTRACT

This document describes techniques and apparatuses directed at reducing inductive-charging power loss. In aspects, a mobile device includes a multi-layer flexible printed circuit board (FPCB) coil that forms a receiver coil having a Litz-wire structure. The FPCB coil includes a multi-trace bundle, having traces systematically routed throughout the different layers of the FPCB coil to reduce eddy current losses.

20 Claims, 9 Drawing Sheets

(56) References Cited

U.S. PATENT DOCUMENTS

| | | | | |
|---|---|---|---|---|
| 2009/0085706 A1* | 4/2009 | Baarman | ............. | H01F 38/14 |
| | | | | 336/200 |
| 2010/0141369 A1* | 6/2010 | Mori | ............. | H01F 17/0033 |
| | | | | 336/200 |
| 2010/0295652 A1* | 11/2010 | Mori | ............. | H01F 17/0033 |
| | | | | 336/232 |
| 2013/0234509 A1* | 9/2013 | Ichikawa | ............. | B60L 53/36 |
| | | | | 307/104 |
| 2019/0270388 A1* | 9/2019 | Ogawa | ............. | B66B 7/00 |
| 2019/0334391 A1* | 10/2019 | Qi | ............. | H01F 38/14 |
| 2021/0193371 A1* | 6/2021 | Saadat | ............. | H01F 27/2804 |

OTHER PUBLICATIONS

"International Search Report and Written Opinion", Application No. PCT/US2021/055767, dated Jan. 26, 2022, 12 pages.

* cited by examiner

Fig. 6 under 35 U.S.C. § 119(e) to Italian Patent Application 102020000025678, filed on Oct. 29, 2020, which are hereby incorporated by reference in it entirety.

TECHNIQUES AND APPARATUSES TO REDUCE INDUCTIVE CHARGING POWER LOSS

This application claims priority under 35 U.S.C. § 119(e) to Italian Patent Application 102020000025678, filed on Oct. 29, 2020, which are hereby incorporated by reference in it entirety.

SUMMARY

This document describes techniques and apparatuses, implemented in mobile devices (e.g., wireless devices, smartphones, laptops), directed at reducing inductive charging power loss. In aspects, a mobile device includes a multi-layer flexible printed circuit board (FPCB) coil that forms a receiver coil having a Litz-wire structure. The FPCB coil includes a multi-trace bundle, having traces that are systematically routed throughout the different layers of the FPCB coil to reduce eddy current losses.

In another aspect, an electronic device is disclosed. The electronic device includes a multi-layer FPCB and a receiver coil. The receiver coil is housed within the multi-layer FPCB and includes stacked layers, a plurality of concentric wire loops, and a bundle of FPCB traces. The stacked layers include first and second layers. The plurality of concentric wire loops are included in each layer of the first and second layers. The bundle of FPCB traces are located on the multi-layer FPCB and form the plurality of concentric wire loops. One or more traces in the bundle are routed systematically between the first and second layers at multiple locations on at least one loop of the plurality of concentric wire loops.

This Summary is provided to introduce simplified concepts of techniques and apparatuses directed at reducing inductive charging power loss, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of techniques and apparatuses directed at reducing inductive charging power loss are described in this document with reference to the following drawings. The same numbers are used throughout the drawings to reference like features and components.

DETAILED DESCRIPTION

This document describes techniques and apparatuses directed at reducing inductive charging power loss. Different coil structures are described herein for a multi-layer FPCB coil that forms a receiver coil having a Litz-wire structure to reduce eddy current losses.

Figure 1:
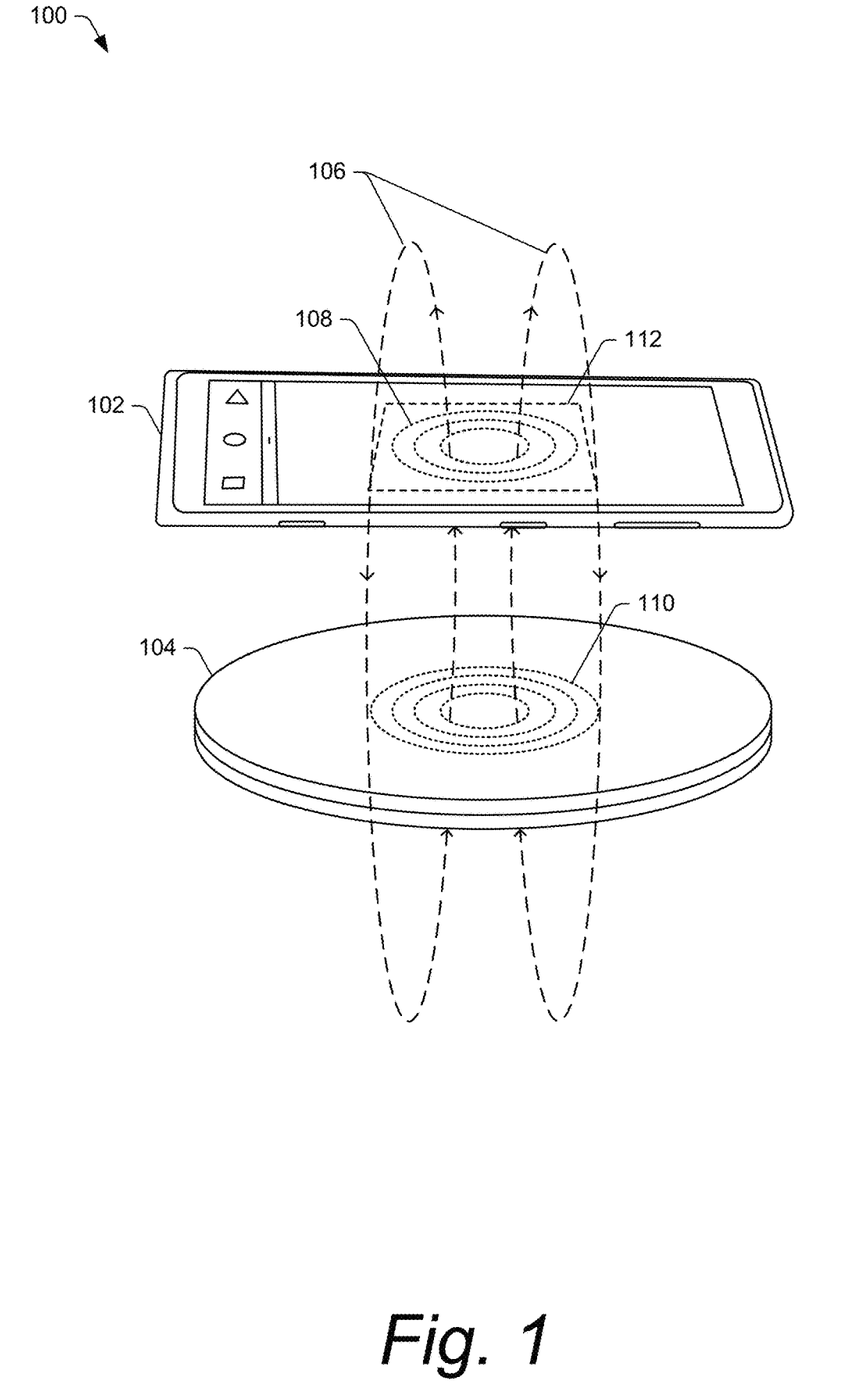
FIG. 1 illustrates an example implementation of an electronic device charging by means of electromagnetic induction.

FIG. 1 illustrates an example implementation 100 of an electronic device 102 charging by means of electromagnetic induction. As illustrated, the electronic device 102 is a smartphone, but the electronic device 102 can be implemented as any suitable electronic device capable of receiving power, via inductive wireless power transfer, to charge a battery of the electronic device 102 (e.g., an internal battery).

The electronic device 102 is positioned above an induction power source 104 (e.g., charging station, inductive pad). Inside the induction power source 104, alternating current (AC current) passes through a coil of wire and produces a fluctuating magnetic field 106 that propagates proportionally to a varying amplitude of the AC current. As a result, when a receiver coil (e.g., a receiver coil 108 inside the electronic device 102) is positioned within the magnetic field 106, the magnetic field 106 generates an electromotive force that induces AC current in the receiver coil 108. Then, the electronic device 102 converts the induced AC current to direct current (e.g., using a rectifier) to charge the battery (not shown in FIG. 1).

In aspects, the receiver coil 108 is composed of a bundle of FPCB traces. The FPBC traces are applied (e.g., printed) onto the FPCB 112 in such a manner as to enable the traces to act as a plurality of separate, thin wires arranged in an electrically parallel configuration. The bundle of FPCB traces may form a Litz-wire structure, which may reduce the tendency of AC current to concentrate near the outer surface of a wire ("skin effect"). In a Litz-wire structure, multiple Litz wires may be wound together in each winding in a twisting pattern to reduce eddy current loss. The skin effect, effectively, limits the cross-sectional area available for the flow of electrons in a conductor, and as a result increases the resistance. By employing multiple traces, the coil disseminates AC current equivalently through all the traces and reduces the skin effect.

The receiver coil 108 may be an inductive coil wound in a shape that substantially matches a geometry of an inductive transmitter coil 110 of an existing wireless-charging device (e.g., induction power source 104), such as those used to wirelessly charge a smartphone. The geometry of the receiver coil 108 and of the inductive transmitter coil 110 may be any suitable geometry, including a disk-like shape, a ring-like shape, a rectangular shape with rounded corners, and so forth. In some implementations, the geometry may be cylindrical to enable inductive and/or resonance wireless charging.

In addition, the receiver coil 108 may be formed on a multi-layer flexible printed circuit board (FPCB) 112 that houses the receiver coil 108 and other circuitry. The multi-layer FPCB 112 may be bonded (e.g., laminated) together and have a suitable thickness to house the receiver coil 108. In an example, the FPCB 112 may include a two-layer FPCB that contains a bundle of traces that form a receiver coil having a Litz-wire structure. In this example, the traces of the receiver coil 108 are routed systematically between a top layer and a bottom layer of the two-layer FPCB. In another example, the multi-layer FPCB 112 may include a four-layer FPCB that contains a bundle of traces that form a receiver coil having a Litz-wire structure, where the traces are routed systematically between adjacent layers of the four-layer FPCB. In a further example, the multi-layer FPCB 112 may include a multi-layer FPCB that contains a bundle of traces that form a receiver coil having a Litz-wire structure, where the traces are routed systematically between adjacent layers of the multi-layer FPCB.

Figure 2A:
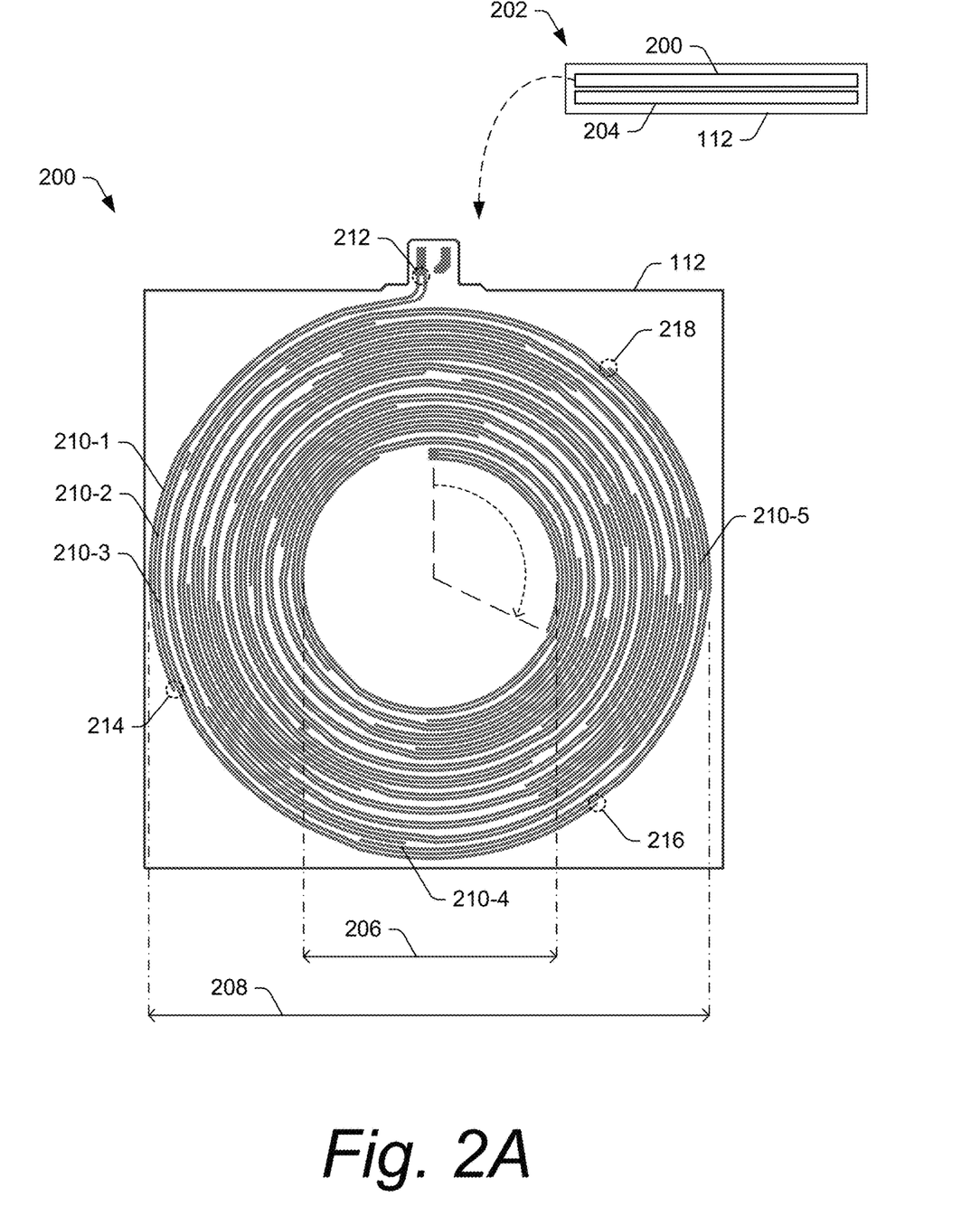
FIG. 2A illustrates an example top layer of a two-layer receiver coil, in accordance with implementations described herein.
Figure 2B:
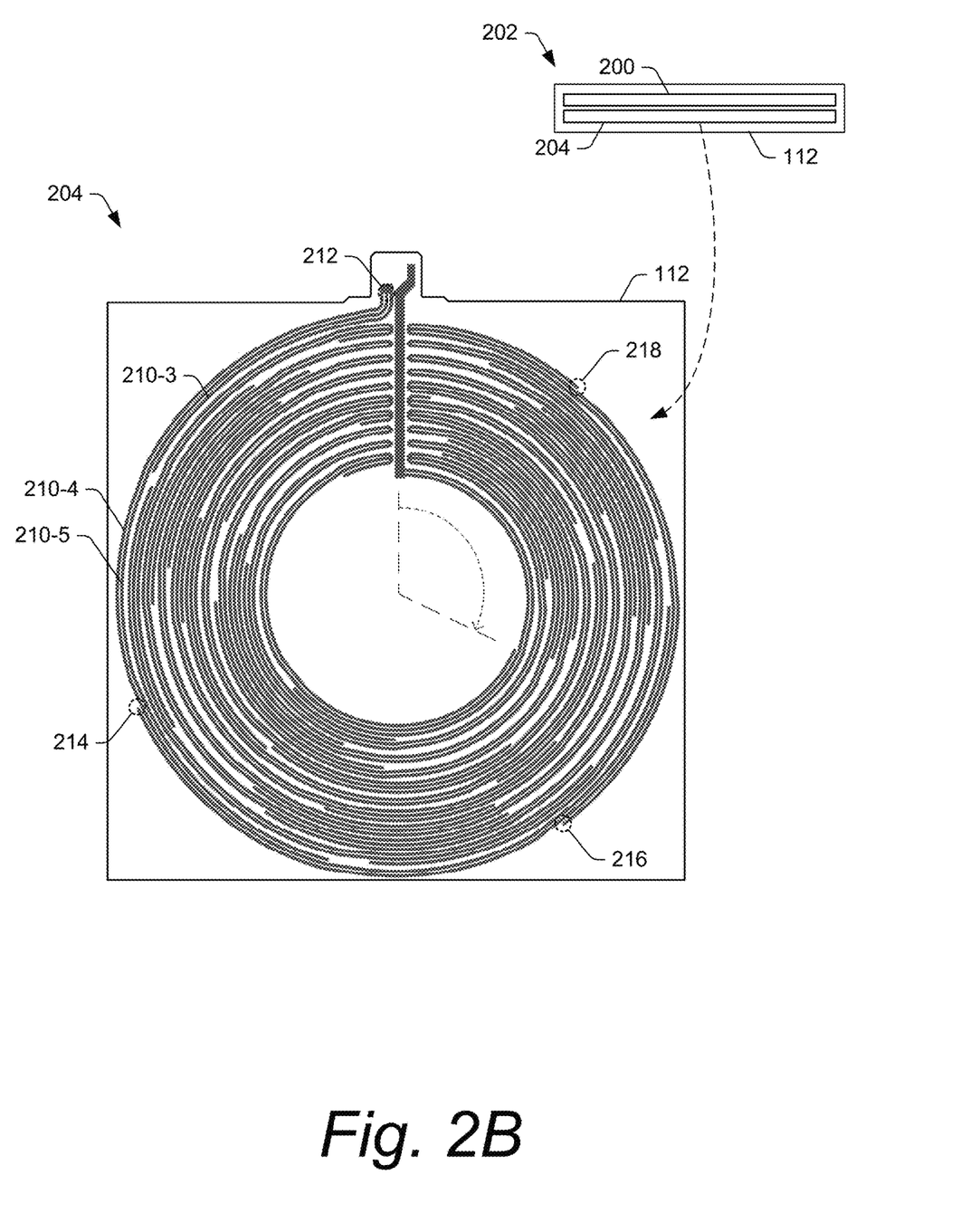
FIG. 2B illustrates a bottom layer of the example two-layer receiver coil from FIG. 2A.

FIGS. 2A and 2B illustrate a receiver coil having a two-layer, full-Litz configuration. In particular, FIG. 2A illustrates an example top layer 200 of a two-layer receiver coil 202 (e.g., receiver coil 108), in accordance with implementations described herein. FIG. 2B illustrates a bottom layer 204 of the example two-layer receiver coil 202 from FIG. 2A.

The receiver coil 202, which may be the receiver coil 108 of FIG. 1, is wound to have an inner diameter 206 and an outer diameter 208. In addition, the receiver coil 202 is housed within the multi-layer FPCB 112 and includes a bundle of FPCB traces forming each coil loop (e.g., winding). The two-layer receiver coil 202 illustrated in FIGS. 2A and 2B is implemented as a full-Litz structure implementation, such that the turns of the coil from the inner diameter 206 to the outer diameter 208 have the same gauge (thickness) as one another. As illustrated, the two-layer FPCB 112 includes a top layer (e.g., the top layer 200) and a bottom layer (e.g., the bottom layer 204). The receiver coil 202 includes multiple FPCB traces (e.g., traces 210) that extend into both layers. In more detail, the receiver coil 202 may include three traces 210 (e.g., trace 210-1, trace 210-2, and trace 210-3) in the bundle.

In one example, one trace in the receiver coil 202 (e.g., trace 210-1) may be routed in the top layer 200 for the first third of the receiver coil loop. The trace 210-1 may then be routed to the bottom layer 204 for another third of the coil loop, then back up to the top layer 200 for yet another third of the coil loop, and so on. Another trace (e.g., trace 210-2) may be routed in the top layer 200 for the first two-thirds of the receiver coil loop, then routed to the bottom layer 204 for a third of the coil loop, then back up to the top layer 200 for a third of the coil loop, then back down to the bottom layer 204 for two-thirds of the coil loop, and so on. The third trace in the Litz wire (e.g., trace 210-3) may be routed in the bottom layer 204 for the first third of the receiver coil loop, then routed to the top layer 200 for another third of the coil loop, then back down to the bottom layer 204 for a third of the coil loop, and so on. This three-trace wiring configuration of the receiver coil 108 in the two-layered FPCB 112 may be referred to as a two-layer, full-Litz configuration. In this way, the receiver coil includes FPCB traces that are routed from layer to layer in an alternating pattern, which includes successive segments of a loop alternating between a greater number and a lesser number of traces in the top layer 200 compared to that of the bottom layer 204. Further, the alternating pattern may alternate which trace in the bundle is transitioned between the layers in each successive portion of the loop.

Although the example of FIG. 2A and FIG. 2B is described with the coil loops as being segmented into thirds, any suitable configuration may be implemented to wind the bundle of traces in a segment of a coil loop and transition one or more of the traces between the layers, including segmenting the coil loop into fourths, fifths, sixths, sevenths, and so on. In some implementations, a coil loop may have the same number of traces as the number of segments in the coil loop. Further, at least one coil loop of the receiver coil 202 may have segments having a length that is different than segment lengths of one or more other coil loops of the receiver coil 202.

In the illustrated example in FIGS. 2A and 2B, the receiver coil 202 includes five traces 210, including the first trace 210-1, the second trace 210-2, the third trace 210-3, a fourth trace 210-4, and a fifth trace 210-5. The first trace 210-1 and the second trace 210-2 are routed in the top layer 200 at an electrical connection point 212. As shown in FIG. 2B, the third trace 210-3, the fourth trace 210-4, and the fifth trace 210-5 are routed in the bottom layer 204 at the electrical connection point 212. Using five traces, the traces 210 may be routed in loop-segment lengths that are approximately one fifth of a coil-loop length. However, the length of loop segments of a coil loop may be different from segment lengths in a different coil loop of the receiver coil 202. The traces 210 may be routed a twisting pattern such that the five traces are routed, at different locations (e.g., transition points 214, 216, 218, and so forth) relative to one another, from the top layer 200 to the bottom layer 204 (and/or from the bottom layer 204 to the top layer 200). At or near the location of a trace 210 transitioning between layers (e.g., transition point 214), the remaining traces may shift toward (or away from) a center of the receiver coil 202. Each trace 210 is routed back and forth between the top layer 200 and the bottom layer 204 throughout the receiver coil 202 in this example. In one example, the coil loop may include transitions between layers that are separated by a segment length that is less than half of a circumference of the coil loop.

The design and utilization of the FPCB traces in the two-layer, full-Litz configuration of FIGS. 2A and 2B may mitigate eddy current losses but may also increase direct current (DC) resistance in the receiver coil. The DC resistance may increase because thin wires have more resistance than thick wires of identical materials. Despite the increase in DC resistance, the two-layer, full-Litz configuration still reduces the total power loss. As a result, inductive charging may operate at higher efficiency for a longer duration, which leads to reduced heat generation and quicker inductive charging.

Figure 3A:
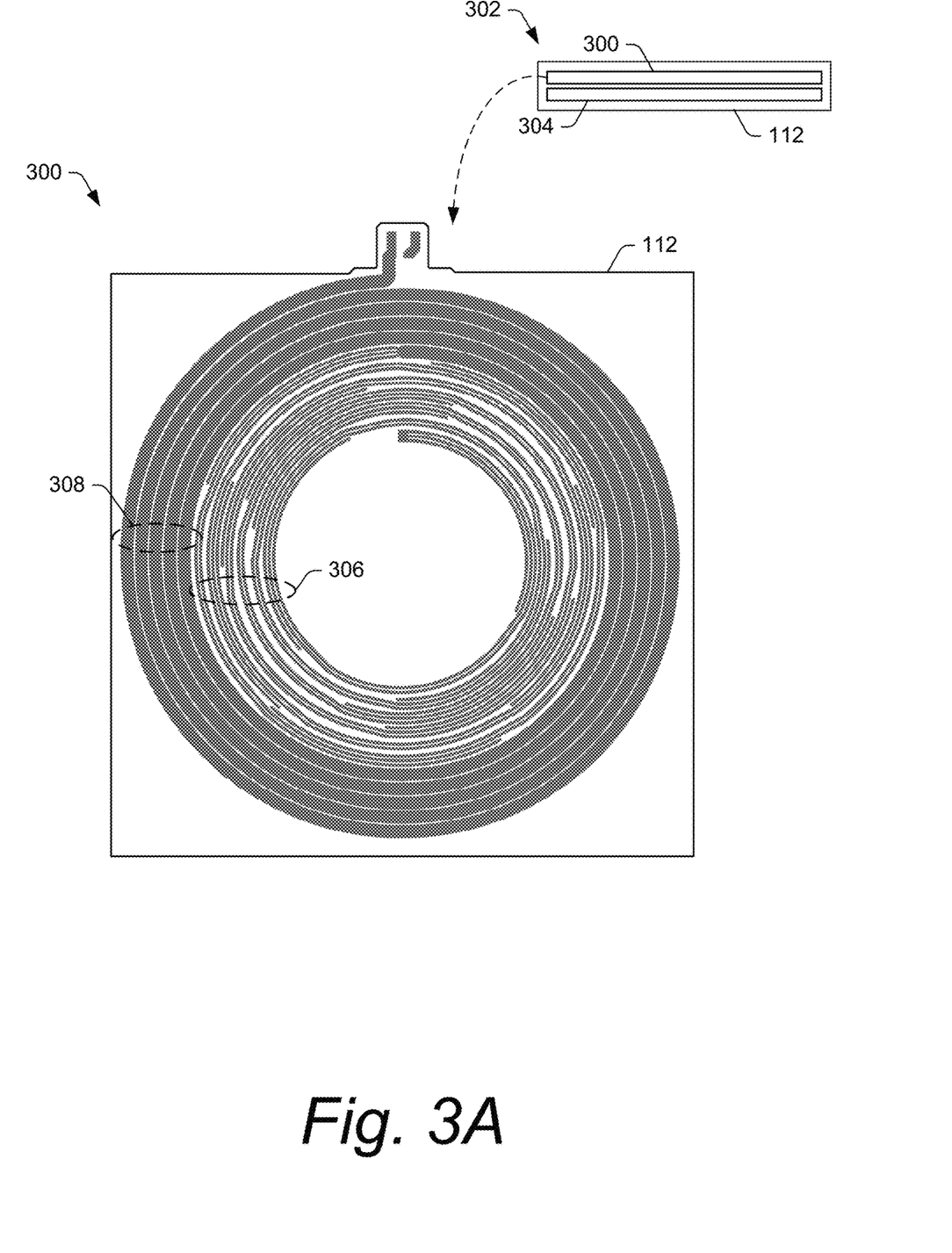
FIG. 3A illustrates a top layer of an example two-layer, hybrid receiver coil.
Figure 3B:
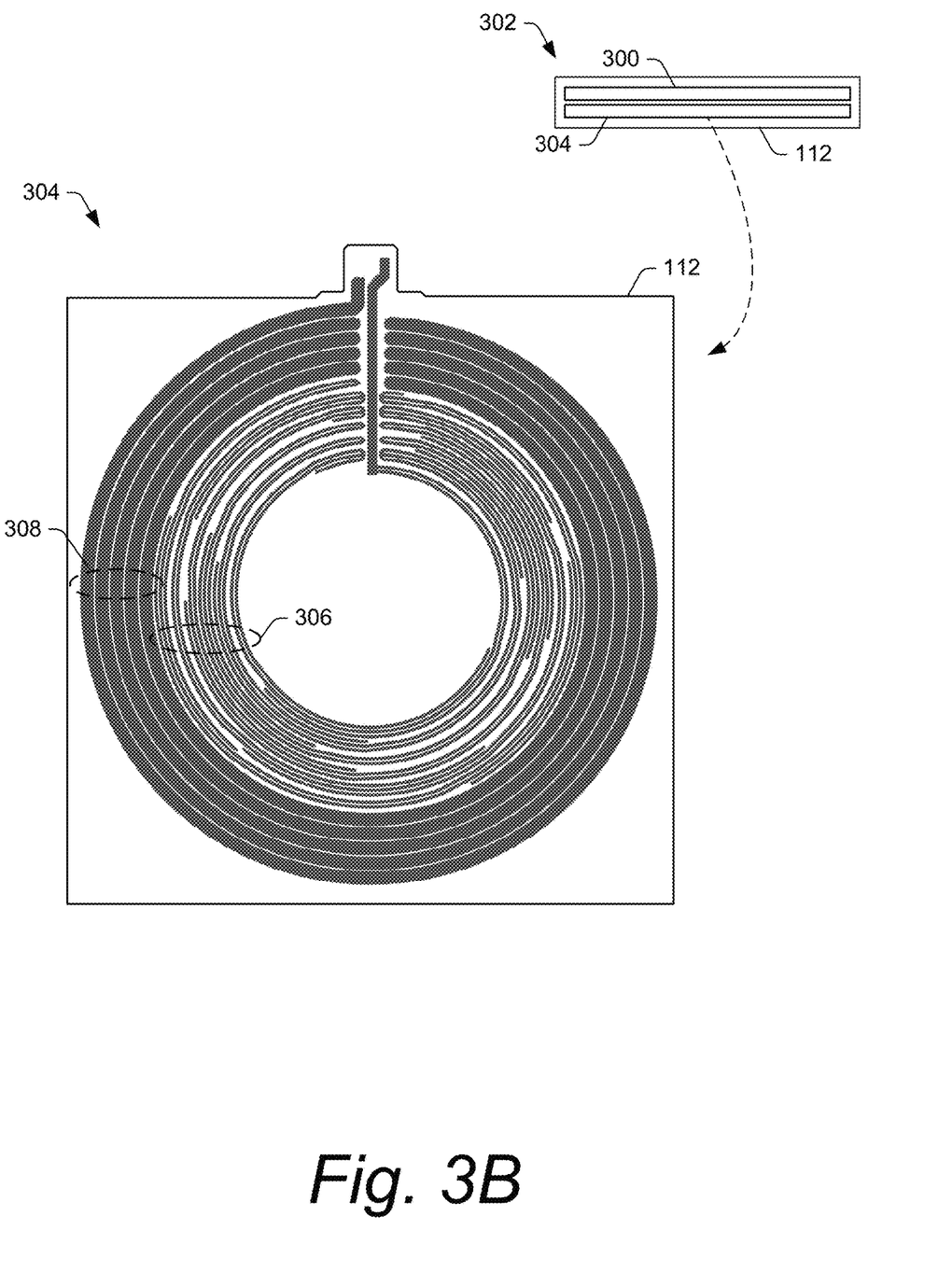
FIG. 3B illustrates a bottom layer of the example two-layer, hybrid receiver coil from FIG. 3A.

FIGS. 3A and 3B illustrates a receiver coil having a two-layer, hybrid-Litz configuration. In particular, FIG. 3A illustrates an example top layer 300 of a two-layer receiver coil 302 (e.g., the receiver coil 108), in accordance with implementations described herein. FIG. 3B illustrates a bottom layer 304 of the example two-layer receiver coil 302 from FIG. 3A.

The receiver coil 302 of FIGS. 3A and 3B, which may be the receiver coil 108 of FIG. 1, includes inner loops 306 and outer loops 308. In addition, the receiver coil 302 is housed within the multi-layer FPCB 112. In the illustrated example, only the inner loops 306 of the receiver coil 302 are wired and routed in a fashion similar to the two-layer, full-Litz configuration described in relation to FIGS. 2A and 2B. The outer loops 308 of the receiver coil 302 may utilize untwisted windings, one thick trace of wire, or another technique to reduce DC resistance loss. In either case, the wire in the outer loops 308 is not systematically routed throughout the different layers of the FPCB for certain segments of the coil loop as it is for the inner loops 306. For example, if the receiver coil 302 is composed of ten loops total, then five outer loops may be wired with one thick trace of wire (e.g., an FPCB trace that is thicker than the bundle of traces in the inner loops) and five inner loops may be wired in a fashion similar to the two-layer, full-Litz configuration of FIGS. 2A and 2B (e.g., the traces being routed systematically back and forth between the top and bottom layers 300 and 304, respectively).

Because eddy current losses are generally most severe in the inner loops 306 of a receiver coil, a two-layer, hybrid-Litz configuration may significantly reduce the losses associated with induced eddy currents. In addition, the two-layer, hybrid-Litz configuration may have a smaller DC resistance in comparison to the two-layer, full-Litz configuration of FIGS. 2A and 2B. As a result of the reduced eddy current losses and small DC resistance, the two-layer, hybrid-Litz configuration significantly reduces the power loss stemming from receiver coils. The benefits of the two-layer, hybrid Litz may be best achieved when the receiver coil is well-aligned (e.g., positioned directly above) with the transmitter coil of the induction power source.

Figure 4A:
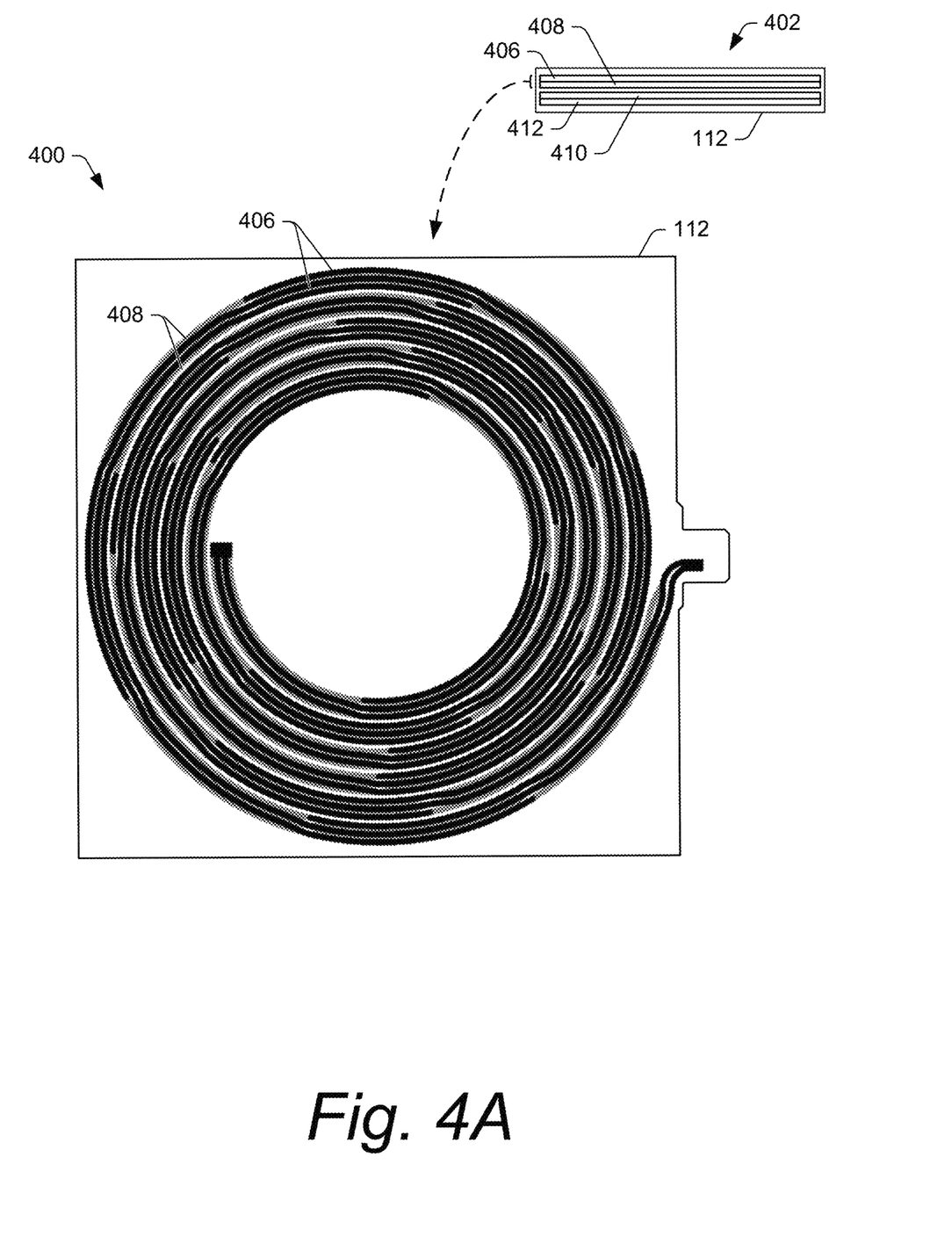
FIG. 4A illustrates a top layer of an example four-layer receiver coil.
Figure 4B:
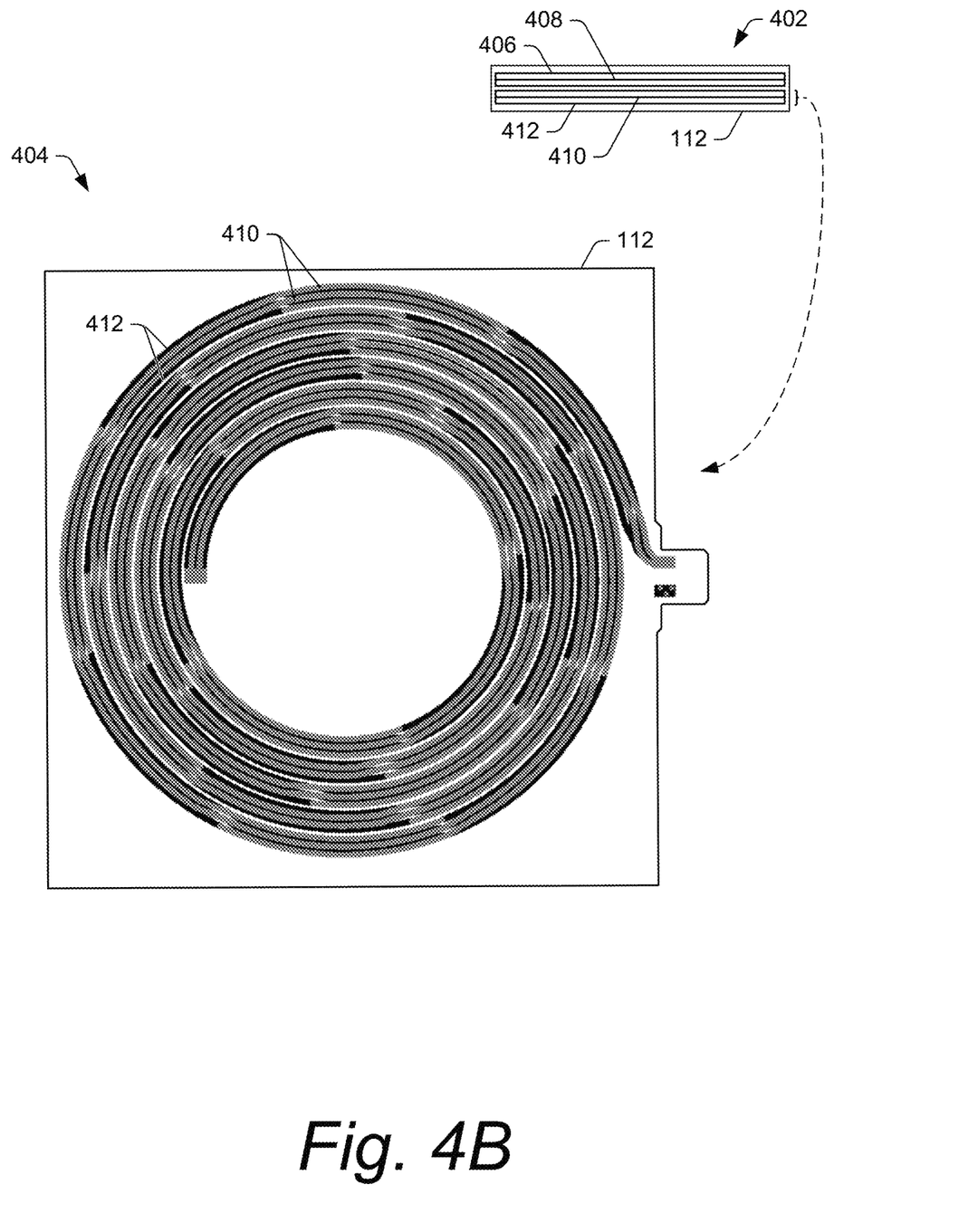
FIG. 4B illustrates a bottom layer of the example four-layer receiver coil from FIG. 4A.

FIGS. 4A and 4B illustrate a receiver coil having a four-layer, full-Litz configuration. In particular, FIG. 4A illustrates example top layer 400 of a four-layer receiver coil 402, in accordance with implementations described herein. FIG. 4B illustrates a bottom layer 404 of the example four-layer receiver coil 402 from FIG. 4A.

The top layer 400 includes a first sublayer 406 and a second sublayer 408. The bottom layer 404 includes a third sublayer 410 and a fourth sublayer 412. In FIG. 4A, the first sublayer 406 is illustrated in front (in a black color) and the second sublayer 408 is illustrated (in a gray color) behind the first sublayer 406. In FIG. 4B, the third sublayer 410 is illustrated in front (in a gray color) and the fourth sublayer 412 is illustrated (in a black color) behind the third sublayer 410. In addition, the receiver coil 402, including the top layer 400 and the bottom layer 404, is housed within the multi-layer FPCB 112.

As illustrated, each loop of the receiver coil 402 is wired in the full-Litz configuration. The four-layer, full-Litz configuration may divide a loop of the receiver coil 402 into segments of substantially equal lengths relative to the length of the loop. For example, each loop may be divided into thirds, fourths, fifths, and the like. Because each loop has a different length (and diameter), the segments of one loop of the receiver coil 402 may have different lengths compared to segments of a different loop of the receiver coil 402. Traces of the receiver coil 402 may be routed systematically between the first sublayer 406 and the second sublayer 408, and between the third sublayer 410 and the fourth sublayer 412. In addition, traces of the receiver coil 402 may also be routed systematically between the second sublayer 408 and the third sublayer 410. In one example, a first set of traces are routed systematically between the first and second sublayers to form a top layer subassembly (e.g., the top layer 400), a second set of traces are routed systematically between the third and fourth sublayers to form a bottom layer subassembly (e.g., the bottom layer 404), and a first subset of the first set of traces and a second subset of the second set of traces are routed systematically between the second and third sublayers.

In the illustrated configuration, power loss associated with induced eddy currents is negligible. Though the four-layer, full-Litz configuration significantly reduces eddy current losses, it also may introduce more DC resistance compared to that of the two-layer configurations described in relation to FIGS. 2A, 2B, 3A, and 3B.

Figure 5:
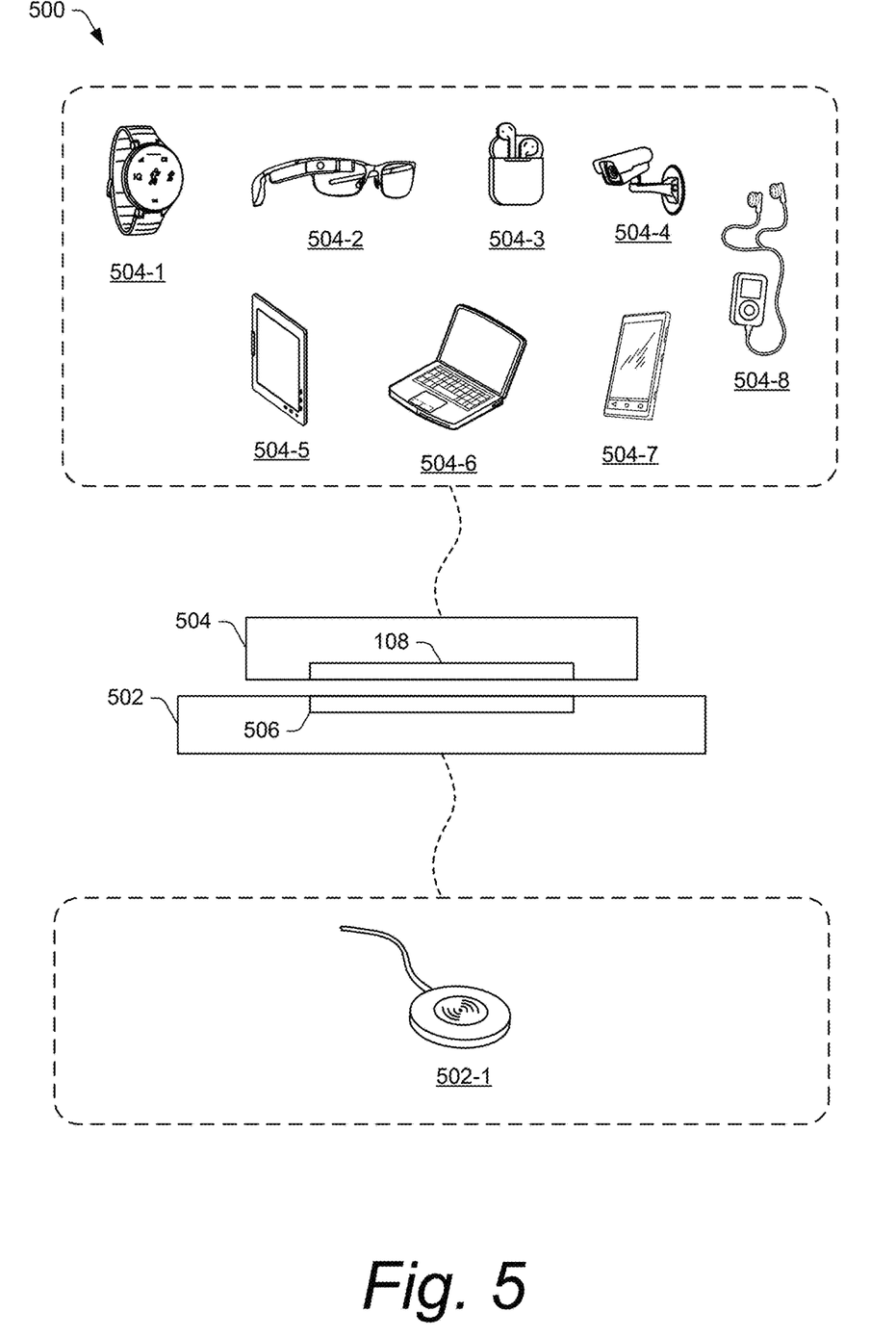
FIG. 5 illustrates a layer stack representing an example system for magnetic inductive wireless charging of an electronic device, using the receiver coil from FIG. 1.

FIG. 5 illustrates a layer stack representing an example system 500 for magnetic inductive wireless charging of an electronic device. A wireless-power transmitter 502 is illustrated as a charger base 502-1. However, any suitable wireless-power transmitter can be used to wirelessly transfer power via magnetic inductive wireless charging of a battery of a receiving device. The wireless-power transmitter 502 can also include other devices capable of implementing wireless charging, such as desktop computers, gaming systems, gaming consoles, audio systems, automobiles, track pads, drawing pads, tablets, laptops, smartphones, netbooks, e-readers, home appliances, and the like.

A wireless-power receiver 504 is illustrated with a variety of example devices, including a computing watch 504-1 (e.g., smartwatch), computing spectacles 504-2 (e.g., smart glasses), an electronic earbuds case 504-3, a security camera 504-4, a tablet 504-5, a laptop 504-6, a mobile phone 504-7 (e.g., smartphone), and a portable audio player 504-5 (e.g., mp3 player). The wireless-power receiver 504 can also include other devices with a small form factor, such as small wireless phones, electronic toothbrushes, electronic razors, drones, wireless gaming controllers, remote controls, digital cameras, and other small battery-powered devices.

The wireless-power transmitter 502 may include a transmitter coil 506, which may be any suitable coil used to generate an electromagnetic field for magnetic inductive wireless-power transmission, including existing coils. In some aspects, the transmitter coil 110 may be implemented as the transmitter coil 506.

The wireless-power receiver 504 may include the receiver coil 108 (e.g., the receiver coil 202, the receiver coil 302, and/or the receiver coil 402), implemented as a receiver coil to generate an electric current, based on exposure to the electromagnetic field, to charge a battery of the wireless-power receiver 504. Efficiency of the power transfer is greatest when the receiver coil 108 is not only aligned with the transmitter coil 506 but also substantially size-matched to the transmitter coil 506. Using the techniques described herein, the receiver coil 108 may improve wireless-charging performance without requiring a change to the size of the receiver coil 108, enabling the receiver coil 108 to continue to be size-matched to existing transmitter coils 506.

Figure 6:
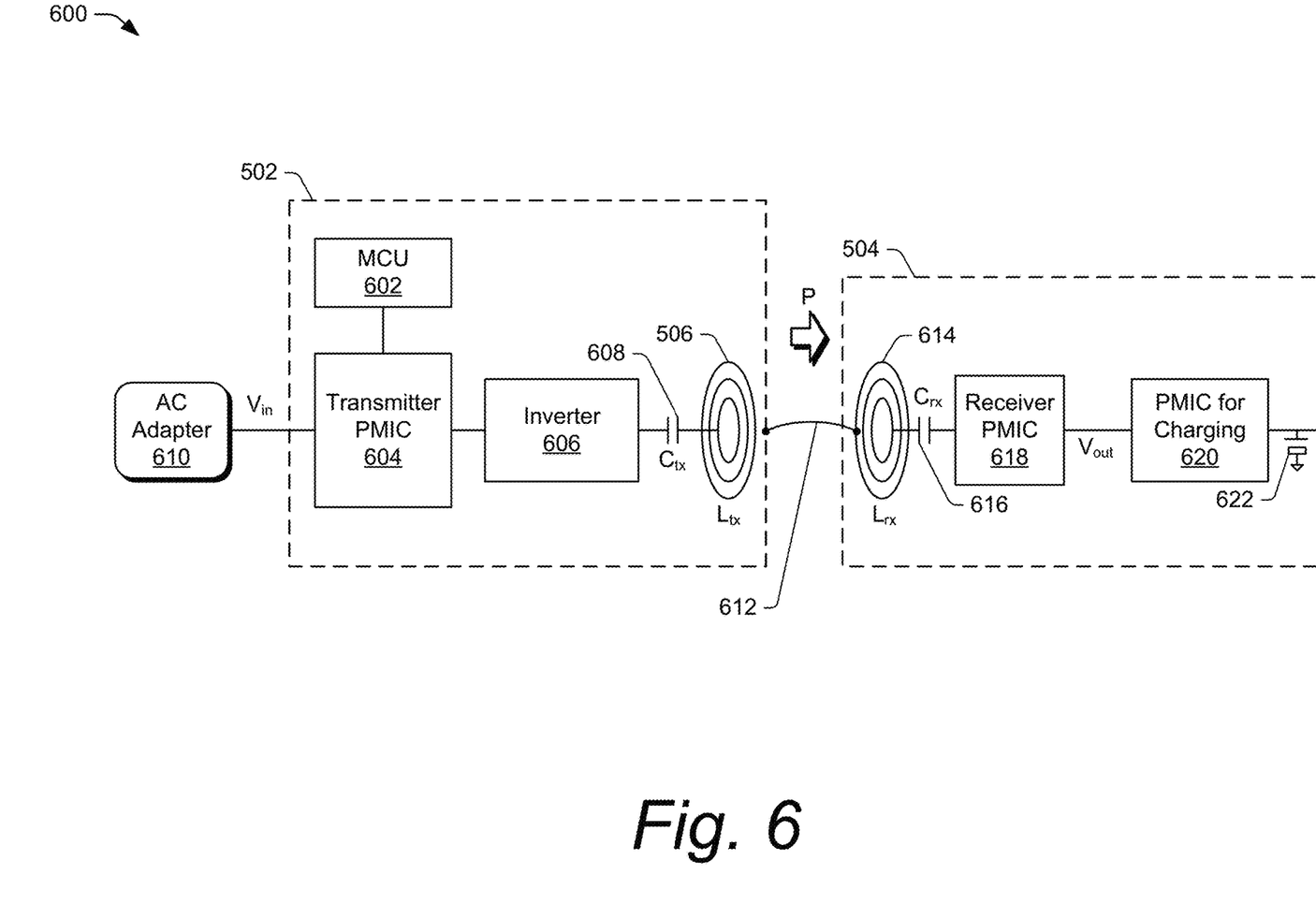
FIG. 6 illustrates a block diagram illustrating an example system using the receiver coil from FIG. 1 for wireless charging of a load.

FIG. 6 illustrates a block diagram illustrating an example system 600 using the receiver coil 108 for wireless charging of a load. The wireless-power transmitter 502 includes a microcontroller unit (MCU) 602 connected to a transmitter power management integrated circuit (PMIC) 604, which is connected to an inverter circuit 606 (e.g., full-bridge inverter circuit, half-bridge inverter circuit). The inverter circuit 606 is connected to one or more capacitors, such as capacitor $C_{tx}$ 608. The capacitor $C_{tx}$ 608 is connected to a transmitter coil $L_{tx}$, such as the transmitter coil 506. The system 600 includes an AC adapter 610 coupled with an AC power supply. The AC adapter 610 provides an input voltage $V_{in}$, which is usable by the transmitter PMIC 604 and the MCU 602 to manage power driven to the transmitter coil 506. The inverter circuit 606 converts a DC input supply voltage (e.g., input voltage $V_{in}$) into symmetric AC voltage of a desired magnitude and frequency. The resultant AC voltage is output to the capacitor $C_{tx}$ 608, which passes the energy to the transmitter coil $L_{tx}$ 506.

The transmitter coil $L_{tx}$ 506 generates a magnetic field 612 and couples to a receiver coil $L_{rx}$ 614 (e.g., the receiver coil 108, which may include any of the receiver coils 202, 302, or 402) to transmit energy to the receiver coil $L_{rx}$ 614. The receiver coil $L_{rx}$ 614 receives the energy from the magnetic field 612 generated by the transmitter coil $L_{tx}$ 506. This energy induces an electric current in the receiver coil $L_{rx}$ 614. The receiver coil $L_{rx}$ 614 passes energy from the electric current to one or more capacitors $C_{rx}$ 616, which then pass the energy to a receiver PMIC 618. The receiver PMIC 618 uses the energy provided by the one or more capacitors $C_{rx}$ 616 to provide an output voltage $V_{out}$ to a PMIC for charging 620. Additionally, the receiver PMIC 618 can provide load modulation back to the wireless-power transmitter 502 in accordance with Qi wireless-charging protocol. Load modulation signals can pass through the receiver coil $L_{rx}$ 614 and on to the wireless-power transmitter 502 via the transmitter coil $L_{tx}$ 506 to enable the wireless-power transmitter 502 to manage the amount of power being transmitted. Additionally, the wireless-power transmitter 502 may provide signals to the wireless-power receiver 504 by using frequency modulation, such as frequency-shift keying (FSK). These modulated signals may pass through the transmitter coil $L_{tx}$ 506 and on to the wireless-power receiver 504 via the receiver coil $L_{rx}$ to enable communication (e.g., control signals or feedback signals) from the wireless-power transmitter 502 to the wireless-power receiver 504. The PMIC for charging 620 provides power management for quick charging of a load, such as load 622 (e.g., battery), by providing a DC current at a voltage level of the load 622.

CONCLUSION

Although aspects of techniques and apparatuses for reducing inductive charging power loss have been described in language specific to features and/or methods, the subject of the appended claims is not necessarily limited to the specific features or methods described. Rather, the specific features and methods are disclosed as example implementations of techniques and apparatuses for reducing inductive charging power loss, and other equivalent features and methods are intended to be within the scope of the appended claims. Further, various different aspects are described, and it is to be appreciated that each described aspect can be implemented independently or in connection with one or more other described aspects.

What is claimed is:

1. An electronic device comprising:
a multi-layer flexible printed circuit board (FPCB); and
a receiver coil housed within the multi-layer FPCB, the receiver coil comprising:
stacked layers including first and second layers;
a plurality of concentric wire loops in each layer of the first and second layers; and
a bundle of FPCB traces located on the multi-layer FPCB and forming the plurality of concentric wire loops, one or more traces in the bundle being routed systematically in a first alternating pattern between the first and second layers at multiple locations on at least one loop of the plurality of concentric wire loops, the at least one loop divided into a plurality of segments, each pair of successive segments of the at least one loop being separated by one of the multiple locations, the first alternating pattern including each successive segment of the at least one loop alternating between a greater number and a lesser number of traces in the first layer compared to a corresponding segment in the second layer.

2. The electronic device of claim 1, wherein the bundle of FPCB traces includes three traces or five traces.

3. The electronic device of claim 1, wherein the first layer and the second layer of the multi-layer FPCB are laminated together.

4. The electronic device of claim 1, wherein the multiple locations on the at least one loop are each separated by a segment having a length that is less than half of a circumference of the at least one loop.

5. The electronic device of claim 1, wherein:
each loop includes a number of segments; and
the bundle of FPCB traces includes a same number of traces as the number of segments.

6. The electronic device of claim 1, wherein the first alternating pattern includes alternating which trace is transitioned between the first and second layers in each successive segment of the at least one loop.

7. The electronic device of claim 1, wherein the FPCB traces transition between the first and second layers at different locations around the at least one loop relative to one another.

8. The electronic device of claim 1, wherein:
the concentric wire loops include multiple inner loops and multiple outer loops;
the multiple inner loops include the bundle of FPCB traces routed systematically between the first and second layers; and
the multiple outer loops include at least one FPCB trace not systematically routed between the first and second layers, the at least one FPCB trace being thicker than the bundle of FPCB traces in the multiple inner loops.

9. The electronic device of claim 8, wherein the multiple outer loops include:
a first portion of at least one FPCB trace located in the first layer;
a second portion of the at least one FPCB trace located in the second layer; and
a third portion of the at least one FPCB trace located in the first layer,
wherein the second portion is located between the first portion and the third portion.

10. The electronic device of claim 1, wherein:
the stacked layers include third and fourth layers;
the plurality of concentric wire loops are also in each of the third and fourth layers; and
the FPCB traces include:
a first set of traces routed systematically between the first and second layers to form a top layer subassembly; and
a second set of traces routed systematically between the third and fourth layers to form a bottom layer subassembly.

11. The electronic device of claim 10, wherein a first subset of the first set of traces and a second subset of the second set of traces are routed systematically between the second and third layers, the second and third layers stacked between the first and fourth layers.

12. The electronic device of claim 10, wherein the first set of traces are routed between the first and second layers in an alternating pattern that includes successive portions of a loop alternating between a greater number and a lesser number of traces in the first layer compared to that of the second layer.

13. The electronic device of claim 12, wherein the alternating pattern includes alternating which trace is transitioned between the stacked layers in each successive portion of the loop.

14. The electronic device of claim 12, wherein the traces transition between the stacked layers at different locations around the loop relative to one another.

15. The electronic device of claim 10, wherein the second set of traces are routed between the third and fourth layers in a second alternating pattern that includes successive portions of a loop alternating between a greater number and a lesser number of traces in the third layer compared to that of the fourth layer.

16. The electronic device of claim 15, wherein the second alternating pattern includes alternating which trace is transitioned between the stacked layers in each successive portion of the loop.

17. The electronic device of claim 15, wherein the traces transition between the stacked layers at different locations around the loop relative to one another.

18. The electronic device of claim 15, wherein:
the plurality of concentric wire loops includes first and second loops;
the first loop divided into a first set of segments;
the second loop divided into a second set of segments; and
segments in the first set of segments have a length that is different compared to that of segments in the second set of segments.

19. The electronic device of claim 1, wherein:
the bundle of FPCB traces includes five traces;
the first layer includes a first loop having at least first, second, and third successive segments;
the second segment separates the first and third segments;
the second layer includes a second loop having at least fourth, fifth, and sixth successive segments stacked with first, second, and third successive segments, respectively, of the first layer;
the fifth segment separates the fourth and sixth segments;
the first and third segments include three traces and the second segment includes two traces; and
the fourth and sixth segments include two traces and the fifth segment includes three traces.

20. The electronic device of claim 19, wherein:
the first segment in the first layer is stacked with the fourth segment in the second layer;
the second segment in the first layer is stacked with the fifth segment in the second layer; and
the third segment in the first layer is stacked with the sixth segment in the second layer.

* * * * *